(12) United States Patent
Inoue et al.

(10) Patent No.: US 7,602,262 B2
(45) Date of Patent: Oct. 13, 2009

(54) ELASTIC WAVE DEVICE AND MANUFACTURING METHOD OF THE SAME

(75) Inventors: Kazunori Inoue, Kawasaki (JP); Takashi Matsuda, Kawasaki (JP); Shogo Inoue, Kawasaki (JP); Xiaoyu Mi, Kawasaki (JP); Jyouji Kimura, Yokohama (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 161 days.

(21) Appl. No.: 11/730,961

(22) Filed: Apr. 5, 2007

(65) Prior Publication Data
US 2008/0018414 A1 Jan. 24, 2008

(30) Foreign Application Priority Data
Jul. 24, 2006 (JP) ............... 2006-200881

(51) Int. Cl.
*H03H 9/00* (2006.01)
*H03H 9/10* (2006.01)
(52) U.S. Cl. ....................... 333/133; 333/193
(58) Field of Classification Search ........... 333/133, 333/193, 194, 195, 196
See application file for complete search history.

(56) References Cited

U.S. PATENT DOCUMENTS

| 6,075,307 | A | 6/2000 | Fukiharu |
| 6,121,161 | A | 9/2000 | Rossman et al. |
| 6,784,765 | B2 * | 8/2004 | Yamada et al. ............... 333/193 |
| 6,984,421 | B2 | 1/2006 | Pahl et al. |
| 6,985,048 | B2 * | 1/2006 | Takamine et al. ........... 333/133 |
| 7,301,421 | B2 * | 11/2007 | Yokota et al. ............... 333/133 |

FOREIGN PATENT DOCUMENTS

WO     01/59827 A1     8/2001

* cited by examiner

*Primary Examiner*—Dean O Takaoka
(74) *Attorney, Agent, or Firm*—Arent Fox LLP.

(57) ABSTRACT

An elastic wave device formed by bonding at least two surface acoustic wave devices by filling a resin therebetween is disclosed. Each of surface acoustic wave (SAW) devices includes a substrate; a functioning portion configured on the substrate; a recess that forms a space portion necessary for operation of the functioning portion, and a package that covers the surface of the substrate, and side faces of the package of the at least two SAW devices, corresponding to a portion bonded by filling of the resin between at least two SAW devices, includes the at least one cutout, and a first resin covers a portion of each of the side faces, the back faces, and the front faces of the substrate of the at least two SAW devices, and the first resin is filled with in the at least one cutout on the side faces of the package.

15 Claims, 10 Drawing Sheets

PRIOR ART

1: SURFACE ACOUSTIC WAVE DEVICE
11: SURFACE ACOUSTIC WAVE SUBSTRATE
12: SURFACE ACOUSTIC WAVE PATTERN
13a, 13b: BONDING PAD PORTION
14a, 14b: CROSSING FINGER ELECTRODE
15: ADHESIVE

PRIOR ART

1: SURFACE ACOUSTIC WAVE DEVICE
11: SURFACE ACOUSTIC WAVE SUBSTRATE
12: SURFACE ACOUSTIC WAVE PATTERN
13a, 13b: BONDING PAD PORTION
14a, 14b: CROSSING FINGER ELECTRODE
16: SOUND ABSORBING MATERIAL
17: ADHESIVE TAPE

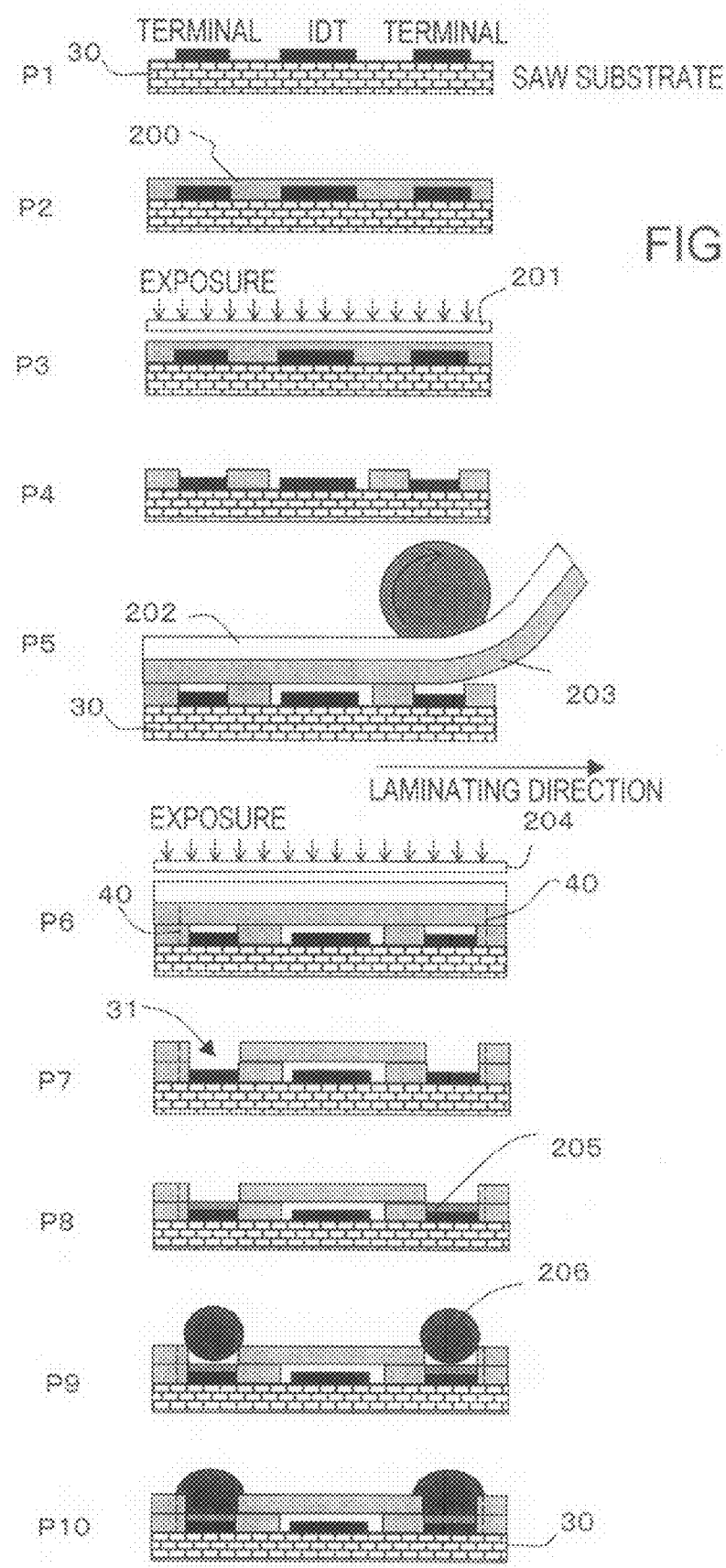

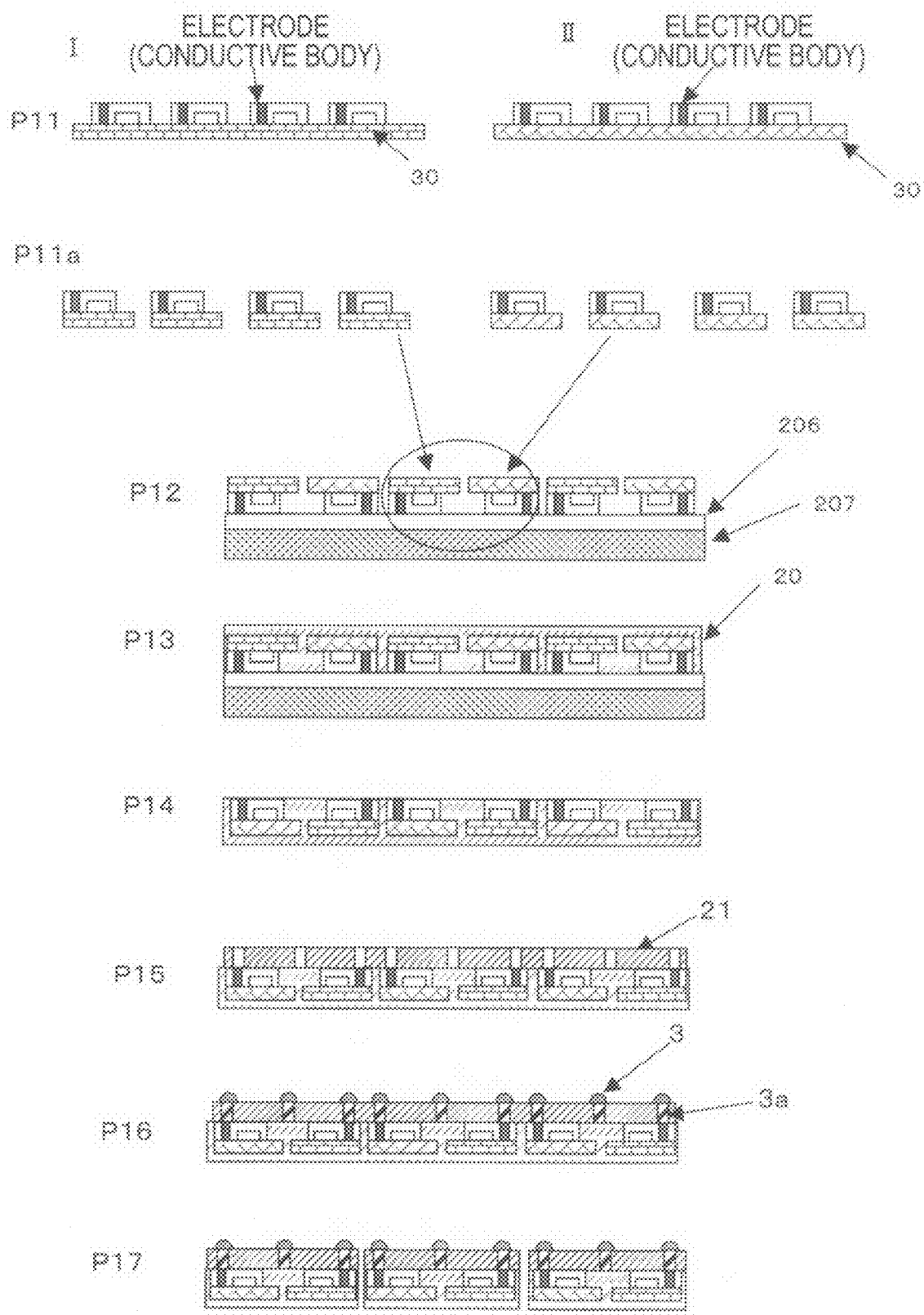

ELASTIC WAVE DEVICE AND MANUFACTURING METHOD OF THE SAME

CROSS-REFERENCE TO RELATED APPLICATIONS

This application is based upon and claims the benefit of priority from the prior Japanese Patent Application No. 2006-200881, filed on Jul. 24, 2006, the entire contents of which are incorporated herein by reference.

BACKGROUND OF THE INVENTION

1. Field of the Invention

The present invention relates generally to an elastic wave device and a manufacturing method of the device, and, more particularly, to a surface acoustic wave device that can function as a filtering device or a resonator used in a functioning unit of, for example, a television set (hereinafter, "TV"), a video tape recorder (hereinafter, "VTR"), a DVD (Digital Versatile Disk) recorder, a portable phone, etc., or an elastic wave device such as an FBAR (Film Bulk Acoustic Resonator) using a piezoelectric film, and a manufacturing method of the devices.

2. Description of the Related Art

Currently, as an elastic wave device, a surface acoustic wave device (hereinafter, "SAW device") is a variously used circuit that processes a wireless signal in a frequency band of, for example, a 45 MHz to 2 GHz band and is widely used in a transmission band-pass filter, reception band-pass filter, a local transmission filter, an antenna duplexer, an intermediate frequency filter, an FM modulator, etc.

An elastic wave device such as an FBAR has also been used as a filter in a frequency band of 1 GHz to 10 GHz.

Recently, downsizing of these signal processing devices has been progressed and a demand for downsizing of electronic parts such as a SAW device and an FBAR used therein is also getting stronger. Demand for multi-band portable phones that can be used in a plurality of different frequency bands is getting stronger and, for portable phones, downsizing and integration of devices are more strongly demanded than single-band devices.

In such a portable phone, a multi-filter incorporating a plurality of filters is used. For the filter, an example of a conventional configuration of a dual filter incorporating two filters is shown in FIGS. 1A, 1B, and 1C (Part I, Part II, and Part III).

FIG. 1A depicts a plan view of the configuration seen from the side of electrode terminal portions of a dual filter incorporating two filter chips C1 and C2. FIGS. 1B and 1C depict respectively a first example and a second example of a different dual filter having the plan configuration seen from the side of the electrode terminal of FIG. 1A common thereto, and depict cross-sectional views taken along a line A-B of FIG. 1A.

Similarly to a single filter, terminal electrodes include signal electrodes (an input terminal IN and an output terminal OUT) and ground electrodes GND and the number of the signal electrodes is increased corresponding to the number of chips. The ground electrodes GND are often made common to enhance the ground.

The cross-sectional view has a configuration as shown in FIG. 1B or FIG. 1C depending on the shape of a ceramic substrate that is an interposer.

In FIG. 1B, a ceramic substrate 1 has a container-like shape and, in the ceramic substrate 1, the filter chips C1 and C2 each formed with bumps thereon are fixed by flip chips 3. The container is closed with an airtight sealing layer 2 as a lid thereof. The space defined by bumps 3 between the filter chips C1 and C2 and the ceramic substrate 1 is propagating space 10 for comb-shaped electrodes formed respectively on the filter chips C1 and C2 that form SAW devices.

Inside the ceramic substrate 1, a re-wiring layer 11 is formed to move the wiring connected by the bumps 3 such that the wiring is placed at the positions and in the shapes of the terminal electrodes IN and OUT-C1 and OUT-C2. The re-wiring layer 11 is used when the ground wiring of the chips is shared.

FIG. 1C depicts the case where the ceramic substrate 1 is plate-shaped 1a and, similarly to the container-shaped type of FIG. 1B, the filter chips C1 and C2 each formed with the bumps 3 thereon are fixed by the flip chips 3. The airtight sealing layer 2 is formed such that the layer 2 covers over the filter chips C1 and C2. In the case of a plate-shaped ceramic substrate 1a, the entire size can be more downsized than the case of the container type by the space reduced due to absence of the frame. However, because the plate-shaped type also needs the propagating space 10 that is defined by the bumps 3, and the re-wiring layer 11 similarly to the case of the container-type, the thickness in the vertical direction is not varied compared to the case of the container-shaped substrate 1 of FIG. 1B.

In the case of a single filter, at the wafer level, downsizing and a thinner shape are being enabled by the packaging executed by forming the above propagating space 10 and the above re-wiring layer 11. An example of wafer-level packaging for a single filter has been proposed in a recent patent application by the inventors of the present application (Japanese Patent Application No. 2005-290969).

For a dual filter, because the optimal electrode film thickness, etc., differ for each frequency, each of a plurality of devices needs to be used separately as one chip and the same method as that used for the wafer-level packaging for a single filter can not be used.

However, techniques described in Japanese Patent Application Laid-Open Publication Nos. 1998-215143 and 1999-16845 are known as approaches for downsizing a plurality of chips at the chip-level. That is, as shown in these patent documents, a method of directly bonding the side faces of chips between the chips with each other is present and chips each formed in an electrode thickness suitable for each frequency for use are directly bonded with each other.

According to the invention described in the above '143 publication, as shown in FIGS. 2A and 2B quoted from the drawings depicted in the above '143 publication, two chips are integrated by bonding only the side faces of the chips with each other (15 in FIG. 2A) or only the upper portions and the lower portions of the side faces respectively with each other (16 and 17 in FIG. 2B).

Otherwise, according to the invention described in the above '845 publication, as shown in FIG. 3 quoted from the drawings depicted in the above '845 publication, only side faces of chips are bonded with each other to integrate the chips with resin adhesive Y having lower elasticity than that of a substrate X.

According to any one of the methods in the above patent documents, it is assumed that the chips are further accommodated in a container after their integration. Therefore, robustness is insufficient when the chips are used as an independent item after their integration.

The re-wiring layer 11 (FIGS. 1B and 1C) to connect a plurality of devices to each other is necessary for a multi-filter. However, in the method of the above '969 application, a wiring layer is formed in a container similarly to that of the conventional techniques of the above '143 and '845 publications and, therefore, the device can not be made thinner in the thickness direction.

SUMMARY OF THE INVENTION

It is therefore the object of the present invention to improve the mechanical strength between chips after integration and improve the method of forming a re-wiring layer when downsizing is facilitated by configuring a dual filter in a method of integrating single filters packaged at the wafer level by bonding the side faces thereof.

In order to achieve the above object, according to a first aspect of the present invention there is provided an elastic wave device formed by bonding at least two surface acoustic wave devices by filling a resin therebetween, wherein each of the surface acoustic wave devices comprises a substrate; a functioning portion configured on the surface of the substrate; and a recess that forms a space portion necessary for operation of the functioning portion, and has a package that covers the surface of the substrate, wherein side faces of the package of each of the at least two surface acoustic wave devices, corresponding to a portion bonded by filling of the resin between the at least two surface acoustic wave devices, comprises at least one cutout(s), and wherein a first resin covers a portion of each of the side faces, the back faces, and the front faces of the substrate of the at least two surface acoustic wave devices and the first resin is filled with in the at least one cutout(s) on the side faces of the package. The at least two surface acoustic wave devices may be a dual filter, that respectively have frequency operation regions different from each other. The first resin may be a thermoset resin such as an epoxy resin or a polyimide resin. The first resin may contain an electrically conductive filler such as silver, carbon, or metal fine powder and may have an electric conductivity. The first resin may contain an inorganic filler such as $SiO_2$ or aluminum nitride.

In order to achieve the above object, according to a second aspect of the present invention there is provided an elastic wave device formed by bonding at least two surface acoustic wave devices by filling a resin therebetween, wherein each of the surface acoustic wave devices comprises a substrate; a functioning portion configured on the surface of the substrate; and a recess that forms a space portion necessary for operation of the functioning portion, and has a package that covers the surface of the substrate, and wherein each of all the side faces of the package comprises at least one cutout(S), wherein a first resin covers a portion of each of the side faces, the back faces, and the front faces of the substrate of the at least two surface acoustic wave devices and the first resin is filled with in the at least one cutout(s) retained on all the side faces of the package. The number of the cutout(s) retained on each of all the side faces of the package may become maximum for the side faces of the package corresponding to portions that are bonded by filling of the resin between the at least two surface acoustic wave devices. A ground terminal may be formed in an area of the substrate exposed due to the cutout(s) of the package. The device may have, in a layer on the package, a conducting portion connected electrically to electrodes of the at least two surface acoustic wave devices and a second resin layer having photo sensitivity formed. The second resin layer may be made of a photo-sensitive epoxy resin or a photo-sensitive polyimide. Solder balls that are connected to the conducting portion may be formed on the second resin layer.

In order to achieve the above object, according to a third aspect of the present invention there is provided a manufacturing method of an elastic wave device, comprising steps of placing, on a first supporting substrate formed with an adhesive layer thereon, a plurality of devices each formed with a functioning portion such that the face formed with the functioning portion of the device thereon faces the adhesive layer; applying a first resin on the surface and the side faces of the plurality of devices placed on the first supporting substrate and filling the first resin between the plurality of devices placed; curing the first resin; peeling the first supporting substrate; forming a second resin layer having photo sensitivity on the face from which the first supporting substrate of the devices has been peeled; making openings for portions to form wirings by patterning the second resin layer; filling an electric layer and solder in the portions opened as the openings; forming solder balls by reflowing the solder that has been filled with; and dividing a device layer by dicing, wherein a device placed on the first supporting substrate formed with an adhesive layer thereon has a substrate; a functioning portion configured on the surface of the substrate; and a recess that forms a space portion necessary for operation of the functioning portion, and has a package that covers the surface of the substrate, wherein a side face of the package of each of the at least two surface acoustic wave devices, corresponding to a portion bonded by filling of the resin between the at least two surface acoustic wave devices, comprises at least one cutout(s). The supporting substrate may be made of a transparent substrate such as a glass place. The step of applying and filling the first resin may include applying the first resin to the supporting substrate in a vacuum or defoaming the first resin in a vacuum after the application thereof. The step of filling an electric layer and solder in the portions opened as the openings may include forming a film of a first seed metal on the entire surface of a second supporting substrate; applying plating protecting resist; patterning the plating protecting resist and opening the wiring layer openings; filling the metal and the solder in the openings by plating using the metal; removing the plating protecting resist; and removing the seed metal in portions other than the portions with conductive materials formed thereon by plating.

By the above features, improvement of the mechanical strength between chips after integration and formation of a re-wiring layer can be simultaneously facilitated when downsizing is facilitated by configuring a dual filter in a method of integrating single filters packaged at the wafer level by bonding the side faces thereof. Thereby, further downsizing of a dual filter is enabled.

BRIEF DESCRIPTION OF THE DRAWINGS

FIG. 11 depicts a flow of steps of fabrication procedure of a filter chip at the wafer level; and FIG. 12 depicts, following the flow of FIG. 11, a manufacture flow of a SAW device of the present invention using two wafer-level packages each having a filter chip used in a different frequency.

DETAILED DESCRIPTION OF THE PREFERRED EMBODIMENTS

Description will be given below in detail for an example of an embodiment of the present invention referring to the accompanying drawings. Though the example of the embodiment describes the case of a SAW device, the present invention can also be applied to an elastic wave device such as a film bulk acoustic resonator (FBAR) in the same method.

The present invention is applicable to not only a dual filter but also a duplexer configured by a plurality of chips such as an IPD and a filter.

Description will be given for an example of an embodiment of a dual filter according to the present invention referring to FIGS. 4, 5A, and 5B.

Figure 1A:
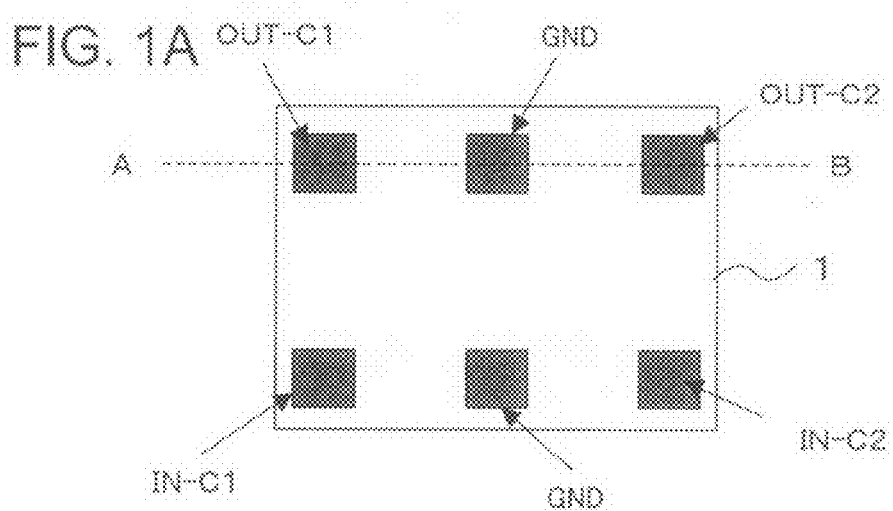
FIG. 1A depicts a plan view of the configuration, seen from the side of an electrode terminal portion, of a dual filter incorporating two filter chips C1 and C2.
Figure 1B:
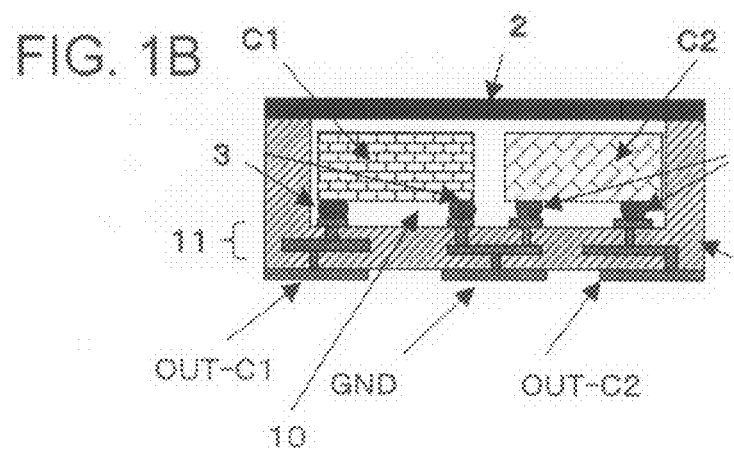
FIGS. 1B depicts a first example of a dual filter having the plan configuration seen from the side of the electrode terminal of FIG. 1A common, and depicts a cross-sectional view taken along a line A-B of FIG. 1A.
Figure 1C:
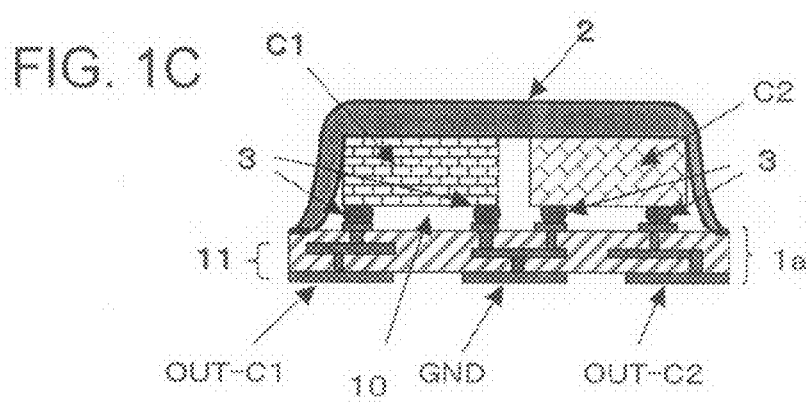
FIGS. 1C depicts a second example of a dual filter having the plan configuration seen from the side of the electrode terminal of FIG. 1A common, and depicts a cross-sectional view taken along a line A-B of FIG. 1A.
Figure 2A:
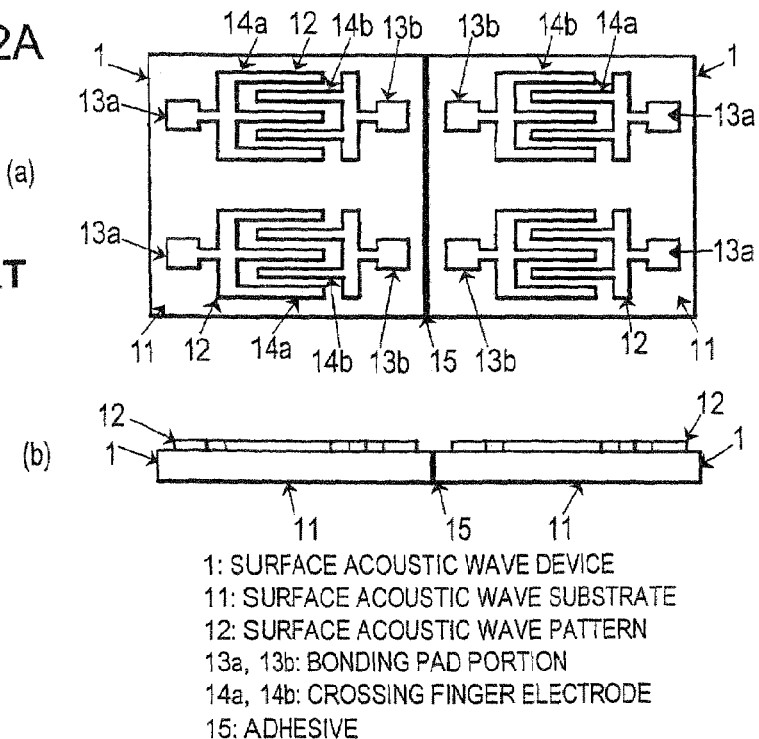
FIG. 2A depicts a first structure of a known example (Japanese Patent Application Laid-Open Publication No. 1998-215143)
Figure 2B:
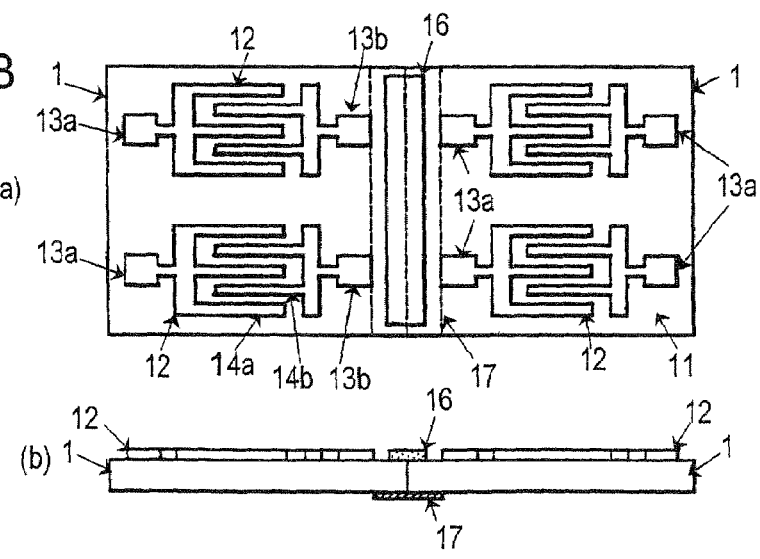
FIG. 2B depicts a second structure of a known example (Japanese Patent Application Laid-Open Publication No. 1998-215143)
Figure 3:
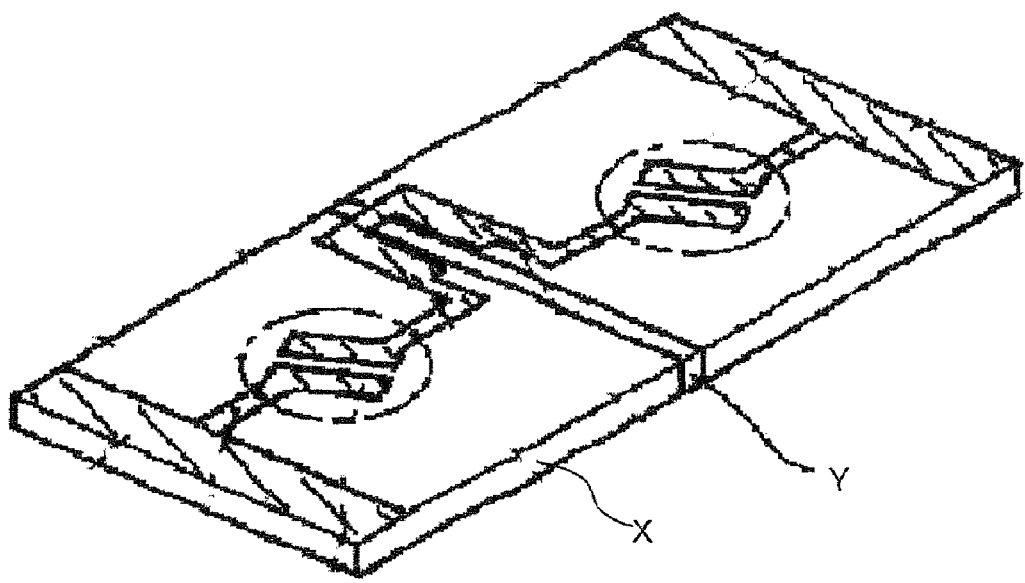
FIG. 3 depicts the structure of a known example (Japanese Patent Application Laid-Open Publication No. 1999-168745)
Figure 4:
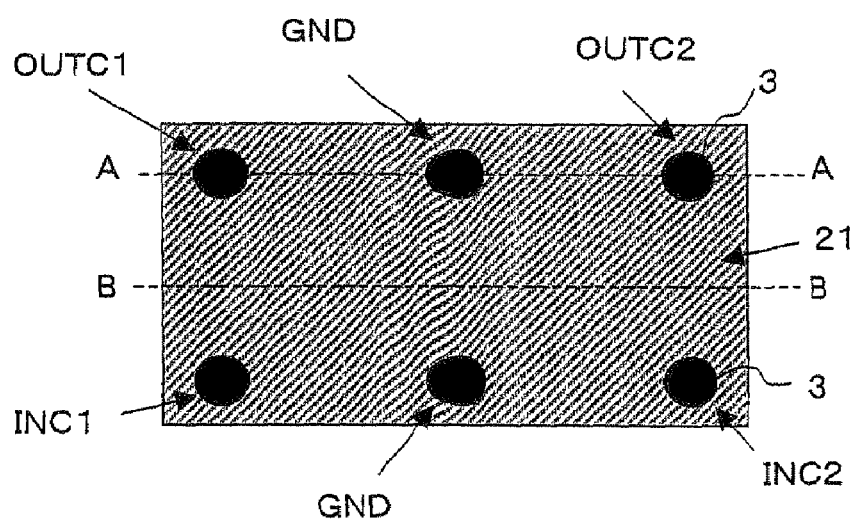
FIG. 4 depicts a plan view of a dual filter of an example of a first embodiment according to the present invention, seen from the side of an electrode terminal.
Figure 5A:
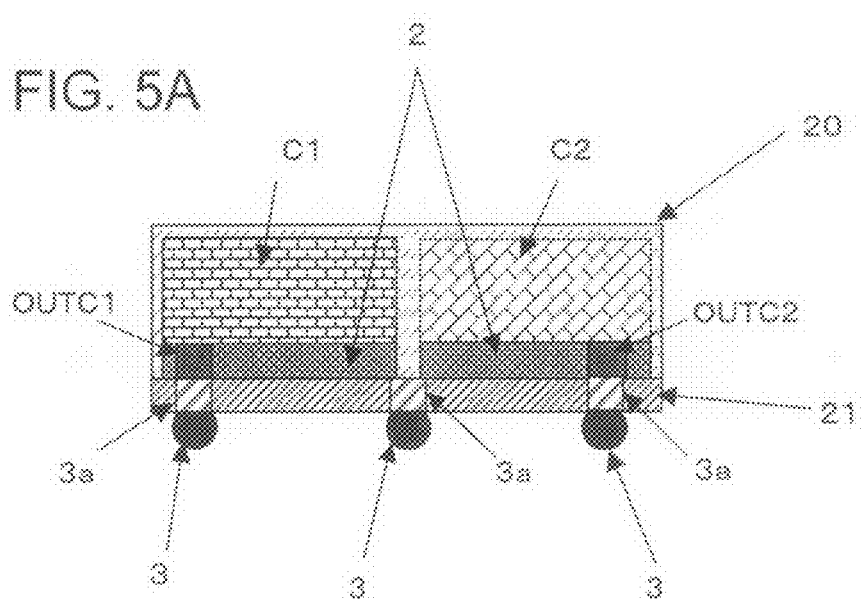
FIG. 5A depicts a cross-sectional view taken along a dotted line A-A of FIG. 4.
Figure 5B:
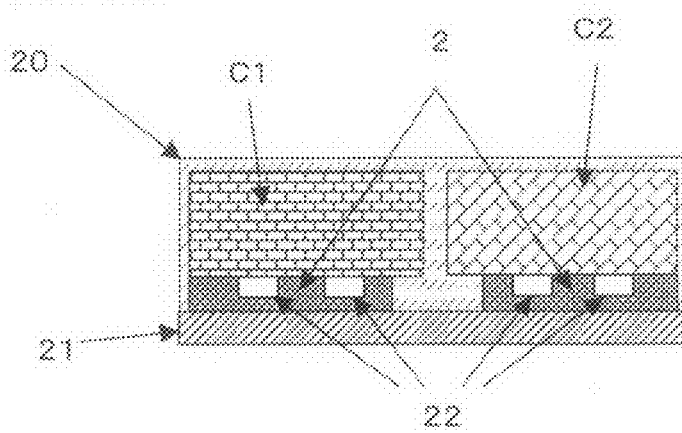
FIG. 5B depicts a cross-sectional view taken along a dotted line B-B of FIG. 4.

FIG. 4 depicts a plan view of a dual filter of an example of a first embodiment according to the present invention, seen from the side of electrode terminals. FIGS. 5A and 5B respectively depict cross-sectional views taken along dotted lines A-A and B-B of FIG. 4.

The dual filter incorporates the two filter chips C1 and C2 that have been packaged at the wafer level, is covered with a first resin layer 20, and is fixed. The first resin layer 20 is made of a thermoset resin such as an epoxy resin or a polyimide resin.

The first resin layer 20 has electric conductivity. The electric conductivity is obtained by containing a metal filler or carbon fine powder. To increase the strength or to enhance the heat dissipating property, the first resin layer 20 may contain a filler such as $SiO_2$ or aluminum nitride.

Hollow space 22 is formed in lid-like packages 2 of the two filter chips C1 and C2 and, thereby, propagation space for a surface acoustic wave is formed.

A second resin layer 21 is formed on the package 2 of the two filter chips C1 and C2 and, therefore, the filter chips C1 and C2 are sealed by the first resin layer 20 and the second resin layer 21. The second resin layer 21 is made of a resin having photo-sensitivity and is made of a photo-sensitive epoxy resin, a photo-sensitive polyimide resin, etc.

Plated electrodes 3a are formed in the second resin layer 21 corresponding to terminal portions (input terminals INC1 and INC2, output terminals OUTC1 and OUTC2) and the ground terminals GND of the filter chips C1 and C2. The terminal portions of the filter chips C1 and C2 are connected to external solder balls 3 through the plated electrodes 3a.

Figure 6:
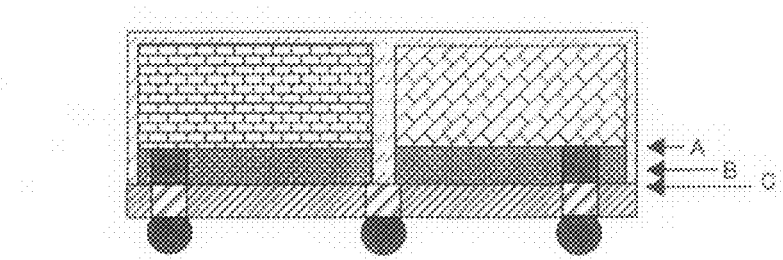
FIG. 6 depicts interface positions A, B, and C in the height direction in the example of the first embodiment.
Figure 7A:
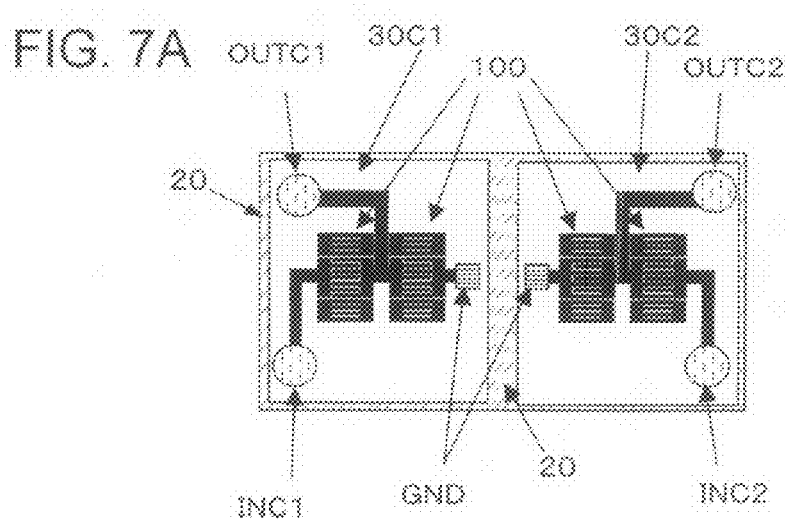
FIG. 7A depicts a plan cross-sectional view corresponding to the interface position A of FIG. 6.
Figure 7B:
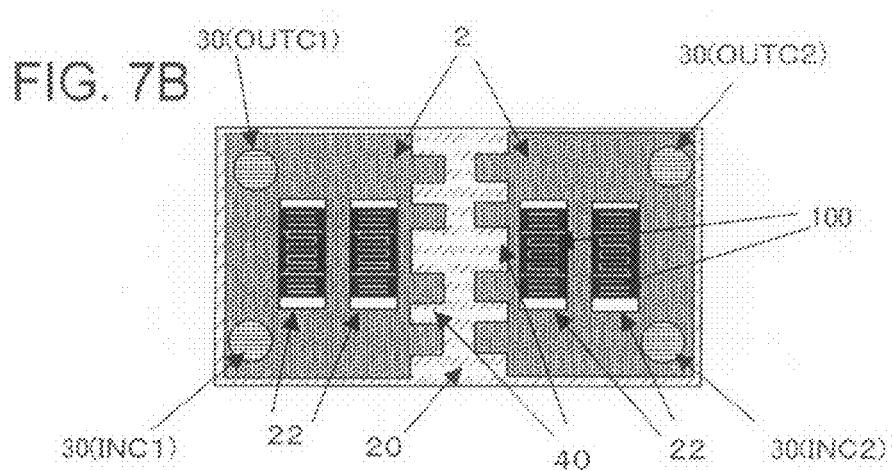
FIG. 7B depicts a plan cross-sectional view corresponding to the interface position B of FIG. 6.

FIGS. 6, 7A, and 7B are further explanatory views of the layer structure of the example of the first embodiment.

FIG. 6 depicts interface positions A, B, and C in the height direction in the example of the first embodiment.

Figure 7C:
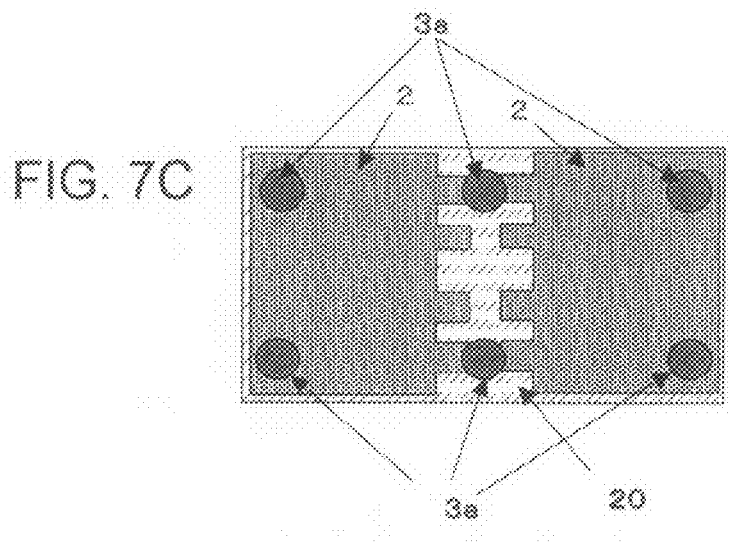
FIG. 7C depicts a plan cross-sectional view corresponding to the interface position C of FIG. 6.

FIGS. 7A, 7B, and 7C respectively depict plan cross-sectional views corresponding to the interface positions A, B, and C of FIG. 6.

FIG. 7A depicts a plan view of the interface position A between piezoelectric substrates 30C1 and 30C2 of the chip filters C1 and C2 and the package 2. Comb-shaped electrodes 100 and wiring layers that form elastic wave filters are formed on the piezoelectric substrates 30C1 and 30C2 of the chip filters C1 and C2. In addition to the wiring layers, input/output terminal patterns INC1, OUTC1, INC2, and OUTC2 that connect to the wiring layers are formed.

Though a ladder-type filter using a SAW resonator is shown in the figures, depiction of actual number of resonators, etc., are omitted. The surroundings of the piezoelectric substrates 30C1 and 30C2 of the chip filters C1 and C2 is covered with the resin layer 20 having electric conductivity.

FIG. 7B depicts a plan view of the interface position B of FIG. 6 and a plan view taken by slicing at almost a half of the thickness of the package 2. The package 2 has openings 31 for the electrodes (INC1, INC2, OUTC1, and OUTC2), cutouts 40, and the hollow space 22.

Input/output terminals INC1, INC2, OUTC1, and OUTC22 for signals are buried in the openings 31. The comb-shaped electrodes 100 are present in the hollow space 22. The ground terminal GND is formed on the piezoelectric substrates 30C1 and 30C2 that correspond to the cutouts 40. The first resin layer 20 having electric conductivity is filled with in the cutouts 40 and is connected electrically to the ground terminal GND.

FIG. 7C depicts a plan view taken by slicing in the interface between the package 2 and the second resin layer 21. The plated electrodes 3a are formed such that the electrodes 3a connect the terminal portions of the solder balls 3, and the terminals INC1, INC2, OUTC1, and OUTC2 provided for the openings 31 of the package 2 and the first resin layer 20 having electrical conductivity.

Due to the above structure, re-wiring of a plurality of chips can be executed without using any interposer (intermediate wiring layer substrate).

Figure 8A:
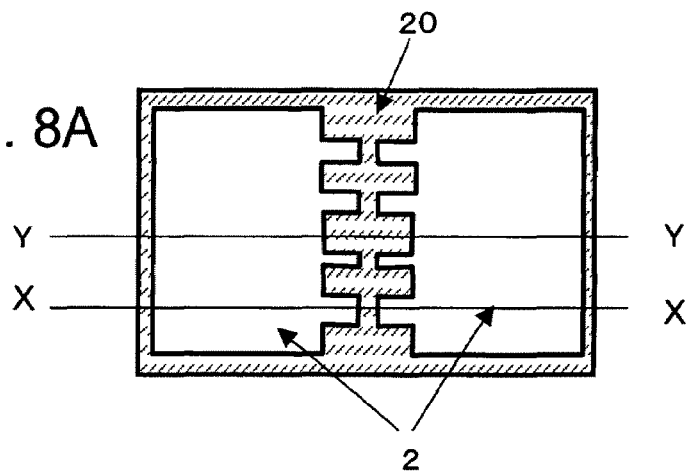
FIG. 8A depicts an area into which the first resin layer is filled with in the plan view of the interface positions corresponding to FIG. 7B.

FIGS. 8A, 8B, 8C, and 8D depict areas into which the first resin layer 20 is filled with. FIG. 8A depicts the area into which the first resin layer 20 is filled with in the plan view of the interface position corresponding to FIG. 7B and the surroundings of the two filter chips C1 and C2 and the cutouts 40 are filled with the first resin layer 20.

Figure 8B:
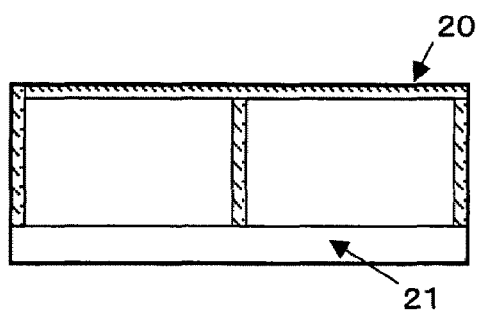
FIG. 8B depicts the area into which the first resin layer is filled with taken in an X-X cross section of FIG. 8A.
Figure 8C:
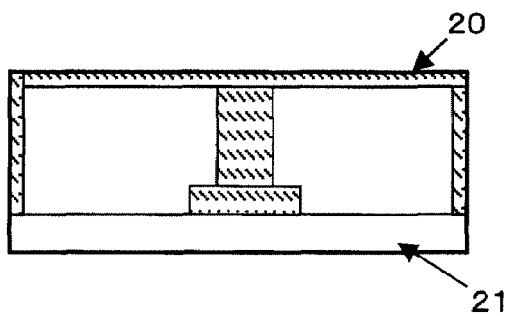
FIG. 8C depicts the area into which the first resin layer is filled with taken in a Y-Y cross section of FIG. 8A.
Figure 8D:
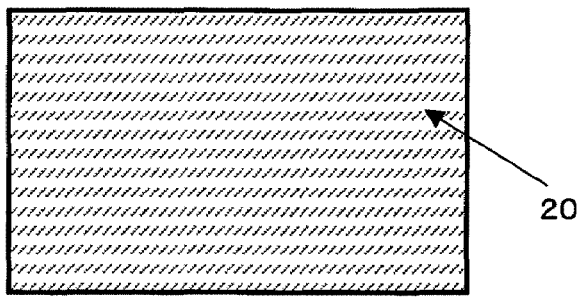
FIG. 8D depicts the area covering two filter chips C1 and C2 on the terminal side and the opposite side thereof, from the upper face thereof.

FIGS. 8B and 8C respectively depict areas filled with the first resin layer 20 in an X-X cross-section and a Y-Y cross-section of FIG. 8A. FIG. 8D depicts the area covering the two filter chips C1 and C2 on the terminal side and the opposite side thereof, from the upper face thereof.

FIG. 8B depicts a cross-section along the X-X line of FIG. 8A and FIG. 8C depicts a cross-section along the X-X line of FIG. 8A. Because a plurality of cutouts 40 are formed on the package 2, the cutouts 40 are filled with the first resin layer 20 and the area contacting the two filter chips C1 and C2 is wide and, therefore, strong adhesion is possible. As can be seen in the cross-section of FIG. 8B, the chips C1 and C2 can be pressed by filling the first resin layer 20 from the upper and lower faces. Thereby, the strength after integration can be more improved.

In application of the present invention, as shown in FIG. 7B, it is desirable to provide many cutouts 40 for the faces to be laminated with each other between the chips C1 and C2 of the package 2 and other aspects are possible. FIGS. 9A, 9B, 10A and 10B depict examples of embodiments of the other cutout structures.

Figure 9A:
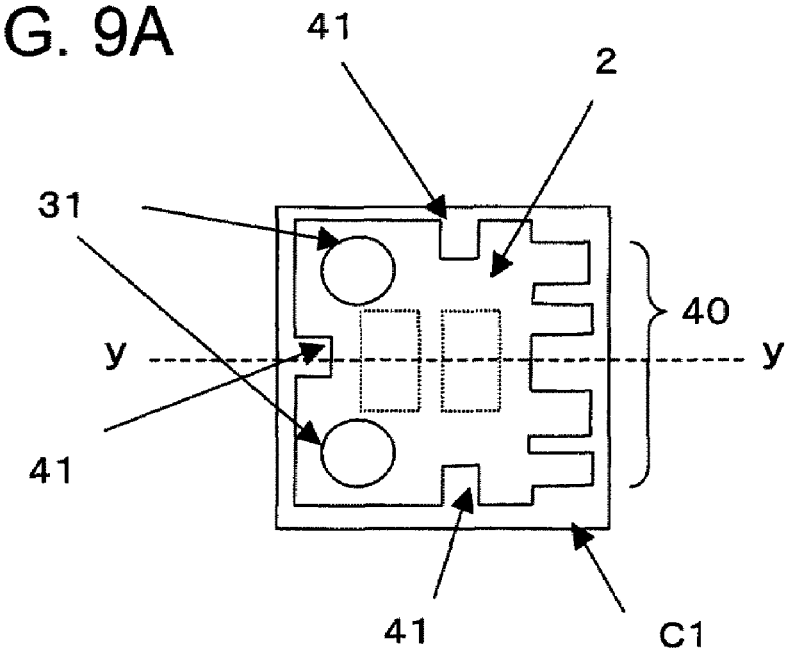
FIG. 9A depicts a plan view of the one chip C1 seen from the terminal side of an embodiment of another cutout structure.
Figure 9B:
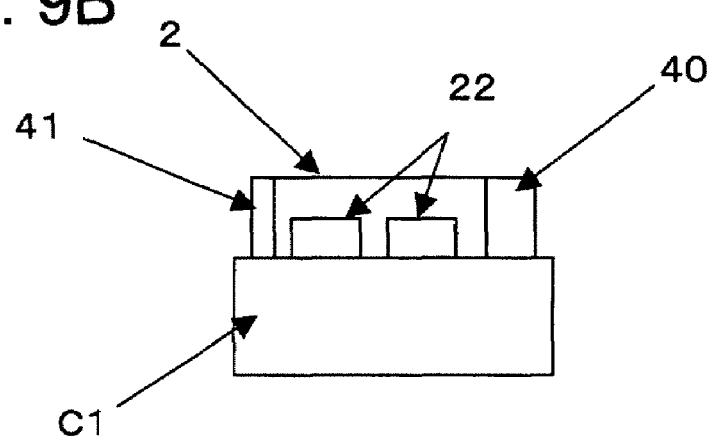
FIG. 9B depicts a side cross-sectional view along a y-y line of FIG. 9A.

An example shown in FIGS. 9A and 9B is an example where cutouts 41 are provided for the side faces in addition to the cutouts 40 provided for the faces of the chips C1 and C2 that are adhered therebetween. FIG. 9A depicts a plan view of the one chip C1 seen from the terminal side and FIG. 9B depicts a side cross-sectional view along the y-y line.

Figure 10A:
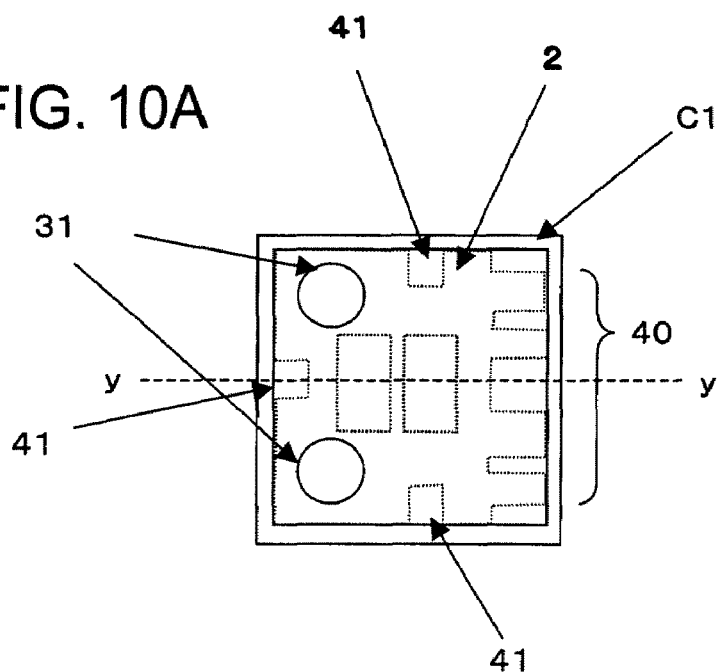
FIG. 10A depicts a plan view of the one chip C1 seen from the terminal side of an embodiment of another cutout structure.
Figure 10B:
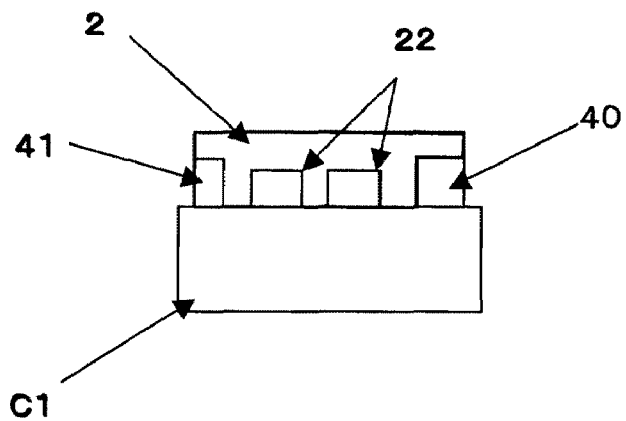
FIG. 10B depicts a side cross-sectional view along a y-y line of FIG. 10A.

FIG. 10A depicts a plan view of the one chip C1 seen from the terminal side and FIG. 10B depicts a side cross-sectional view along the y-y line. Similarly, this is an example where cutouts 41 are provided for the side faces in addition to the cutouts 40 provided for the faces of the chips C1 and C2 that are adhered therebetween. However, this example differs from the example shown in FIGS. 9A and 9B in that the cutouts 40 and 41 are formed not for the entire thickness but for a portion of the package 2 and each cutout has a recessed shape. In this case, the number of contact faces between the resin layer 20 and the package 2 is increased and, therefore, more strong bonding can be expected.

Description will be given for a manufacturing method of a SAW device according to the present invention referring to FIGS. 11 and 12.

FIG. 11 depicts a flow of steps of fabrication procedure of a filter chip at the wafer level. Process steps P1 to P11 are shown for one chip.

An IDT, input and output terminals, and a GND terminal configuring each of a plurality of SAW devices are formed on a wafer-shaped piezoelectric substrate 30 (process step P1). Thereon, resist is applied by spin-coating (process step P2).

Exposure is executed using a mask 201 (process step P3) and the resist in the masked area is baked and left and posts are formed (process step P4).

A laminating film 203 that is a photo-sensitive material is adhered to a transparent supporting film 202 and the films 202 and 203 are laminated along and on the posts formed at process step P4 (process step P5). Terminal portion areas are exposed using a mask 204 and the supporting film 202 is peeled after the exposure (process step P6). Development and baking are executed (process step P7). Thereby, the terminal portion areas (the openings 31) are exposed.

As a feature according to the present invention, when the terminal portion areas (the openings 31) are exposed, the cutouts 40 are formed on the side faces of the posts in the pattern of the mask 204 to obtain the features of the elastic wave device of the present invention.

Plating 205 of a barrier metal such as nickel is applied on the exposed terminal portions (process step P8). Solder balls 206 are placed on the plating 205 (process step P9) and reflow is executed (process step P10). The package at the wafer level is produced by the above steps.

FIG. 12 depicts a further process flow to finish a SAW device from the package at the wafer level.

In FIG. 12, when a plurality of filter chips each used in a different frequency band are packaged commonly to produce one SAW device, for each different frequency band, a wafer-level package is manufactured according to the above process steps P1 to P10.

An example shown in FIG. 12 uses two wafer-level packages I and II each having a filter chip used at a different frequency, that are manufactured separately having the configuration of FIG. 11.

As shown in I and II of FIG. 12, each of two wafers that is packaged at the wafer-level in advance is divided by dicing into devices (process steps P11 and P11a).

Each chip is arranged on a supporting substrate 207, to which an adhesive layer 206 is adhered, such that the face with the device comes on the back of the substrate 207 (process step P12). For the adhesive layer 206, a layer that can be easily peeled later is desirable and a layer of which the adhesiveness can be easily weakened by applying a UV light beam, etc., is used. For the supporting substrate 207, a transparent substrate is desirable and glass is desirable.

The first resin layer 20 is applied on the surface. At this time, by applying in an ambient vacuum or by vacuum defoaming after the application, heat curing is executed such that the resin infiltrates into gaps between chips and the cutouts 40 of the package in the front face (process step P13).

By applying a UV light beam through the back face of the supporting substrate 207, the adhesiveness of the adhering layer 206 of the supporting substrate 207 is weakened and the supporting substrate 207 adhered to the front face of the chips is peeled (process step P14).

The second resin layer 21 having photo-sensitivity in the front face thereof is formed and openings are provided to the portions corresponding to the electrode terminal portions by exposure and development (process step P15).

The electrodes 3a and the solder balls 3 are formed in the openings by printing or plating.

When the above formation is executed by printing, silver paste and solder paste are printed in a method such as vacuum printing. Reflow is executed later and the solder balls 3 are formed (process step P16).

When the above formation is executed by plating, a seed metal is sputtered on the surface of the second resin layer 21 and, thereafter, plating protecting resist is applied. The resist is patterned such that the second resin layer 21 has openings at positions corresponding to the portions of the plated electrodes 3a. Thereafter, the electrodes and solders are formed by plating. After removing the plating protecting resist, the seed metal is removed and, thereafter, reflow is executed and the solder balls are formed.

Areas except a wiring layer pattern are protected by resist having plating resistance after forming a seed metal on the front face by sputtering, etc., electrolytic plating is executed, and, thereby, a wiring pattern is formed. Thereafter, the resist against plating and the seed metal are removed.

By dividing the substrate into individual pieces by dicing, the SAW device according to the present invention is finished (process step P17).

As described above, according to a structure and a manufacturing method of the elastic wave device of the present invention, when a dual filter is configured and downsizing thereof is facilitated in the method of integrating single filters packaged at the wafer level by bonding the side faces of the single filters, improvement of the mechanical strength between the chips after integration and formation of a re-wiring layer can be facilitated. Thereby, further downsizing of a dual filter is enabled and a significant industrial contribution can be made.

The foregoing description of the embodiments is not intended to limit the invention to the particular details of the examples illustrated. Any suitable modification and equivalents may be resorted to the scope of the invention. All features and advantages of the invention which fall within the scope of the invention are covered by the appended claims.

What is claimed is:

1. An elastic wave device formed by bonding at least two surface acoustic wave devices by filling a resin therebetween, wherein
each of the surface acoustic wave devices comprises:
a substrate;
a functioning portion configured on the surface of the substrate;
a recess that forms a space portion necessary for operation of the functioning portion; and
a package that covers the surface of the substrate, wherein
side faces of the package of each of the at least two surface acoustic wave devices, corresponding to a portion bonded by filling of the resin between the at least two surface acoustic wave devices, comprises at least one cutout, and wherein
a first resin covers a portion of each of the side faces, the back faces, and the front faces of the substrate of the at least two surface acoustic wave devices and the first resin is filled with in the at least one cutout on the side faces of the package.

2. The elastic wave device of claim 1, wherein
the at least two surface acoustic wave devices are a dual filter, that respectively have frequency operation regions different from each other.

3. The elastic wave device of claim 1, wherein
the first resin is a thermoset resin such as an epoxy resin or a polyimide resin.

4. The elastic wave device of claim 3, wherein
the first resin contains an electrically conductive filler such as silver, carbon, or metal fine powder and has an electric conductivity.

5. The elastic wave device of claim 4, wherein
the first resin contains an inorganic filler such as $SiO_2$ or aluminum nitride.

6. An elastic wave device formed by bonding at least two surface acoustic wave devices by filling a resin therebetween, wherein
each of the surface acoustic wave devices comprises:
a substrate;
a functioning portion configured on the surface of the substrate;
a recess that forms a space portion necessary for operation of the functioning portion; and
a package that covers the surface of the substrate, wherein
each of all the side faces of the package comprises at least one cutout, and wherein
a first resin covers a portion of each of the side faces, the back faces, and the front faces of the substrate of the at least two surface acoustic wave devices and the first resin is filled with in the at least one cutout retained on all the side faces of the package.

7. The elastic wave device of claim 6, wherein
the number of the cutout retained on each of all the side faces of the package becomes maximum for the side faces of the package corresponding to portions that are bonded by filling of the resin between the at least two surface acoustic wave devices.

8. The elastic wave device of claim 1, wherein
a ground terminal is formed in an area of the substrate exposed due to the cutout of the package.

9. The elastic wave device of claim 6, wherein
a ground terminal is formed in an area of the substrate exposed due to the cutout of the package.

10. The elastic wave device of claim 1, wherein
the device has, in a layer on the package, a conducting portion connected electrically to electrodes of the at least two surface acoustic wave devices and a second resin layer having photo sensitivity formed.

11. The elastic wave device of claim 6, wherein
the device has, in a layer on the package, a conducting portion connected electrically to electrodes of the at least two surface acoustic wave devices and a second resin layer having photo sensitivity formed.

12. The elastic wave device of claim 10, wherein
the second resin layer is made of a photo-sensitive epoxy resin or a photo-sensitive polyimide.

13. The elastic wave device of claim 11, wherein
the second resin layer is made of a photo-sensitive epoxy resin or a photo-sensitive polyimide.

14. The elastic wave device of claim 10, wherein
solder balls that are connected to the conducting portion are formed on the second resin layer.

15. The elastic wave device of claim 11, wherein
solder balls that are connected to the conducting portion are formed on the second resin layer.

* * * * *